(12) United States Patent
Goel et al.

(10) Patent No.: US 7,774,682 B2
(45) Date of Patent: Aug. 10, 2010

(54) PROCESSING CONFIGURATION DATA FRAMES

(76) Inventors: Ashish Kumar Goel, S 1/8 A-1, Gilat Bazar, Varanasi, Uttar Pradesh (IN) 221 002; Namerita Khanna, 228A, DDA-MIG Flat, Rajauri Garden, New Delhi (IN) 110 027; Davinder Aggarwal, B3A/287 Janakpuri, New Delhi (IN) 110 028

( * ) Notice: Subject to any disclaimer, the term of this patent is extended or adjusted under 35 U.S.C. 154(b) by 324 days.

(21) Appl. No.: 12/032,448

(22) Filed: Feb. 15, 2008

(65) Prior Publication Data

US 2008/0215935 A1 Sep. 4, 2008

Related U.S. Application Data

(63) Continuation of application No. 10/667,199, filed on Sep. 18, 2003, now Pat. No. 7,350,134.

(51) Int. Cl.
*G11C 29/00* (2006.01)
*G01R 31/28* (2006.01)
(52) U.S. Cl. .................... 714/764; 714/725
(58) Field of Classification Search ........... 714/707, 714/725, 746, 764; 326/38–41; 716/16
See application file for complete search history.

(56) References Cited

U.S. PATENT DOCUMENTS

| 5,457,408 | A | * | 10/1995 | Leung ............... 326/38 |
| 5,870,586 | A | | 2/1999 | Baxter |
| 6,031,391 | A | * | 2/2000 | Couts-Martin et al. ..... 326/38 |
| 6,560,743 | B2 | | 5/2003 | Plants |
| 7,111,224 | B1 | | 9/2006 | Trimberger |

OTHER PUBLICATIONS

Altera, "Configuring APEX 20K, FLEX 10k & FLEX 6000 Devices", *Altera's Application Note 116*, (May 2000),pp. 1-77.
Altera, "Configuring FLEX 8000 Devices", *Altera's application note 33*, (Jun. 2000),pp. 33-71.
Xilinx, "Virtex FPGA Series Configuration and Readback", *Xillinx's Application note XAPP138*, (Jul. 11, 2002),pp. 1-39.
Xilinx, "XC4000E and XC4000X Series Field Programmable Gate Arrays", *The Programmable Logic databook 1999 version 1.6*, (May 14, 1999),pp. 6-49-6-72.

* cited by examiner

*Primary Examiner*—Shelly A Chase

(57) ABSTRACT

In at least some embodiments, a Programmable Logic Device (PLD) is configured to using a counter in conjunction with a threshold value to determine whether a configuration data frame is to be reloaded into a frame register if errors are encountered. In at least other embodiments, a Programmable Logic Device (PLD) is configured to sequentially load configuration data frames into a frame register, check for errors in the configuration data frames during sequentially loading, and correct errors during sequentially loading without reloading one or more previously-loaded different configuration data frames.

37 Claims, 5 Drawing Sheets

PROCESSING CONFIGURATION DATA FRAMES

RELATED APPLICATION

This application is a continuation of and claims priority to U.S. patent application Ser. No. 10/667,199, filed on Sep. 18, 2003, now U.S. Pat. No. 7,350,134 the disclosure of which is incorporated by reference herein.

BACKGROUND

PLDs are widely used for implementing digital logic. A PLD is configured for the desired circuit prior to use. For this purpose the PLD incorporates a configuration memory that defines its functional behavior based on data stored in it. Field Programmable Gate Arrays (FPGAs) are the most widely used PLD devices. A typical FPGA includes a matrix of logic blocks, routing resources and I/O blocks. In addition to this it also includes configuration memory cells and configuration control logic. Values stored in the memory cell control the operation of FPGA, i.e., functionality of FPGA is defined by the values stored in FPGA memory cells. Bits are loaded in the configuration memory cells through a configuration logic that is provided by configuration devices.

FIG. 1 defines a conventional FPGA configuration process flow as described in ALTERA's application note 116 "Configuring APEX20K, FLEXI OK, FLEX6K devices, ALTERA's application note 33 "Configuring FLEX8K devices", Virtex's application note XAPP138 "FPGA Series Configuration and Readback" and Xiinx. Inc.'s "The programmable Logic databook 1999". The FPGA is first brought into the configuration mode 100, following which the configuration memory is cleared 102. The configuration memory is cleared by storing 0's or 1's in all the cells of the memory. In case of partial configuration, configuration memory is not cleared and step 102 is bypassed. In step 104, configuration data is loaded frame by frame. After each frame is loaded, an error detection circuit checks the frame for any error in step 106. There are several methods for checking the frame for errors such as parity check, Cyclic Redundancy Check (CRC) etc., but the most popular method is a CRC check. If no error is detected in the frame, then the process moves onto step 108 to check whether the end of configuration process has been reached or not. If the configuration process is not over, i.e., more frames are still to be loaded, the process flow reverts to step 104 and the next frame is loaded. Subsequently steps 106 and 108 are followed again until the end of configuration of the FPGA. When the end of configuration is reached, the FPGA device comes back to the start up mode as shown in step 110. After the device is configured it can start its normal operation.

If any error is detected in the data frame at step 106, the STATUS signal is set into the 'High' state in step 107, indicating an error in the data frame. The configuration is stopped and the process restarts all over again from step 100 and all the frames are reloaded again. This method of configuration of a FPGA device is inefficient because even if an error occurs in the last frame to be loaded to the device, all the frames successfully loaded prior to that frame have to be loaded again, leading to wastage of time.

DETAILED DESCRIPTION

A typical FPGA device can be configured in various modes out of which the most common is a Slave and Master mode. In Master mode, the FPGA controls its configuration operation. The clock signal and memory addresses are provided by the FPGA itself to the configuration device, typically a programmable read only memory (PROM). On the other hand, when the FPGA works in slave mode, an external controller, typically a Master FPGA, controls its configuration process. The external controller or master FPGA controls the configuration operation by providing the clock and memory addresses.

Figure 1:
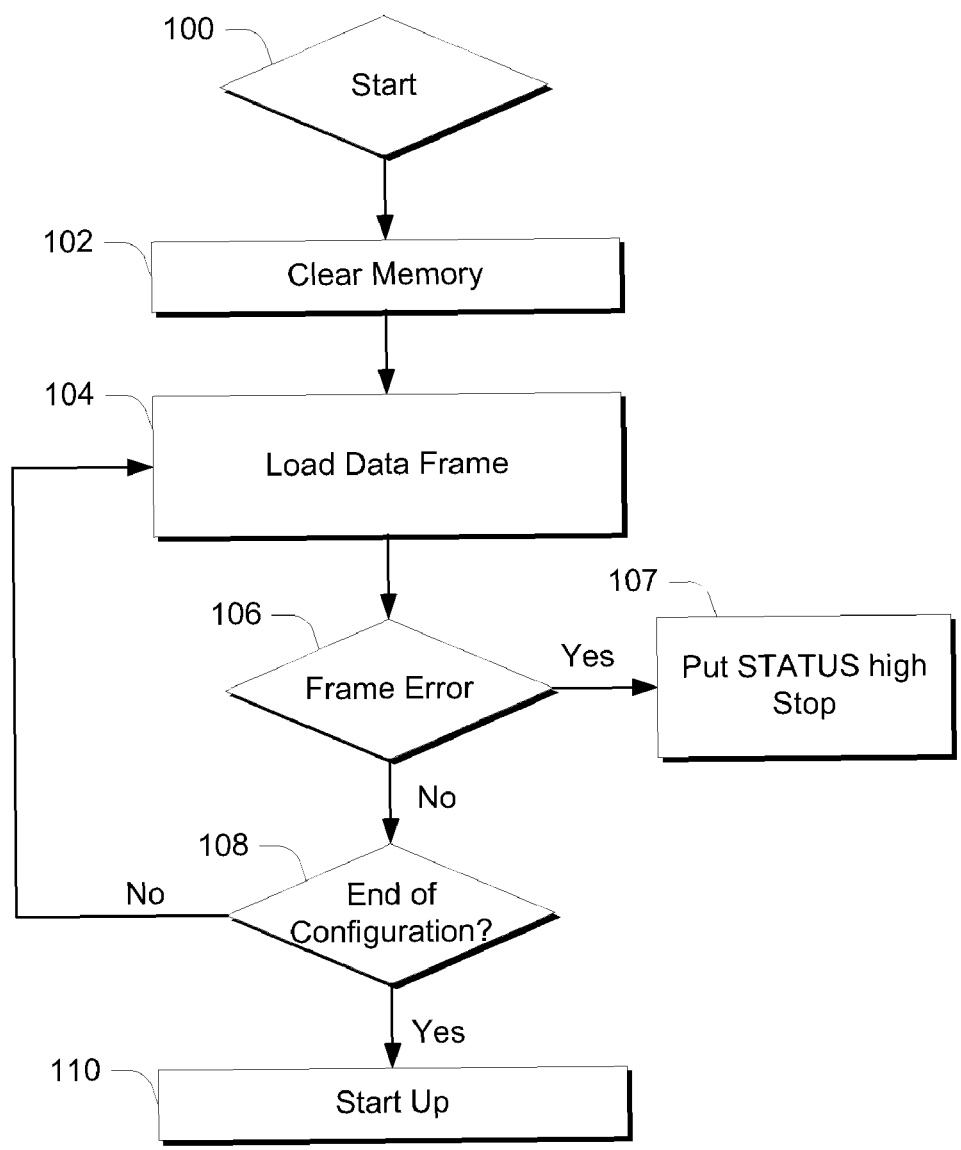
FIG. 1 is a flow chart illustrating a conventional configuration process of a FPGA device.

FIG. 1, which shows the prior art configuration process, has already been described above.

Figure 2:
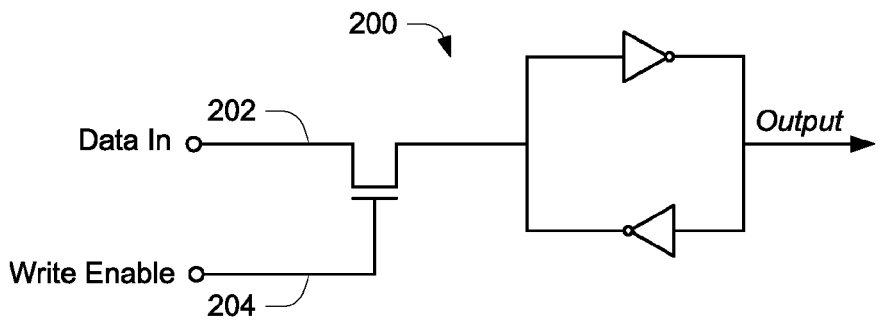
FIG. 2 shows a configuration memory cell of a conventional FPGA.

FIG. 2 shows a configuration memory cell 200 used in a conventional FPGA device. The memory cell has a write enable (WE) signal line 204 that receives signals to control the storage of data in the memory cell 200. To enable storing of data in the memory cell 200, the state of the WE signal 204 is set to 'high', following which the data available at input DATAIN 202 is latched in the memory cell 200. Once the data has been stored, the WE signal 204 reverts back to a "low" state. The WE signal 204 may also be controlled by a logic wherein it allows data to be latched when in the 'low' state while remaining in the 'high' state otherwise.

Figure 3:
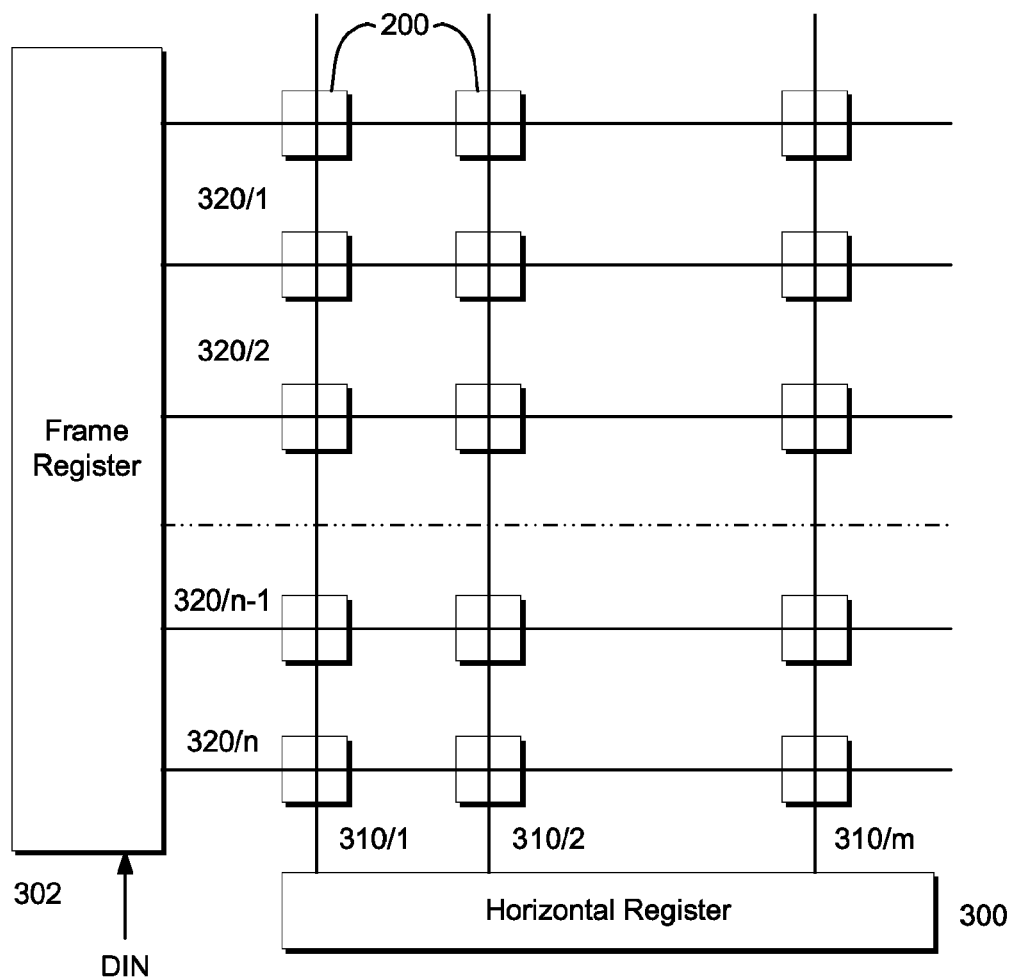
FIG. 3 shows an arrangement of configuration memory cells in a conventional FPGA.

FIG. 3 shows arrangement of configuration memory cells 200 (as described in FIG. 2) in a conventional FPGA. These memory cells 200 are arranged in the array of rows and columns. All memory cells 200 in a particular row share the same data line while all memory cells 200 in a particular column share a common write enable signal line. Write enable signals are generated by a horizontal register 300 and data signals are the output of the FRAME register 302.

Frame register 302 is a shift register. Data input to the frame register 302 is through input DIN. At the start of the configuration process, data is loaded in the frame register. At this time all write-enable signals 310/1, 310/2 ... 310/m to the memory cell columns are disabled. After one complete frame is loaded in the frame register 302, one of the write enable signals, for example signal 310/1 is enabled and configuration data is loaded in the first column through the data lines 320/1, 320/2 ... 320/n. Following this, a new data frame is loaded in the frame register 302 and the write-enable signal 310/2 for the next column of memory cells 200 is enabled and data is loaded in the corresponding memory cells 200 from the frame register 302 through the data lines 320/1, 320/2 ... 320/n. This process continues until all the memory cells 200 have been loaded with the configuration data.

Figure 4:
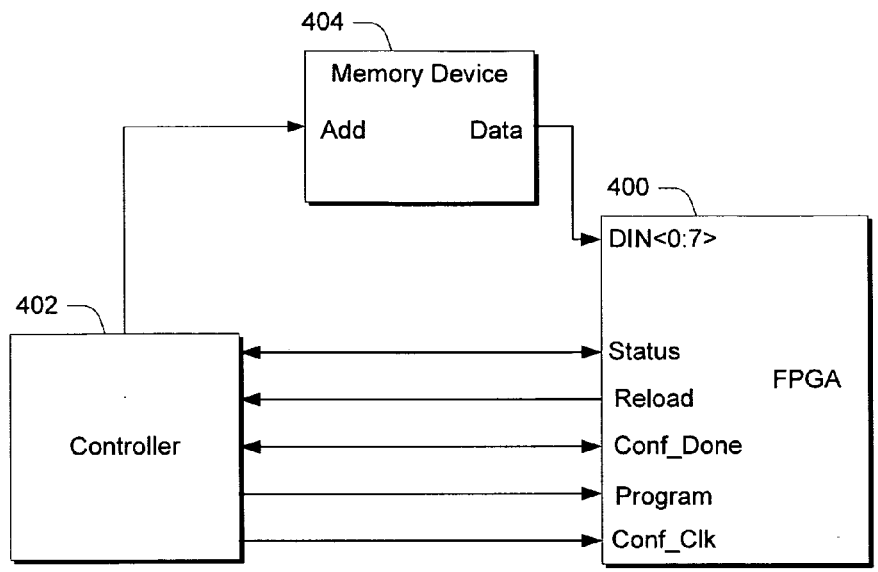
FIG. 4 shows an interface of FPGA with an external controller and memory device when working in SLAVE mode.

FIG. 4 shows an interface of FPGA 400 with an external controller 402 and memory device 404 when working in SLAVE mode, that can be employed in one or more embodiments. In slave mode, the controller 402 provides addresses to the memory device 404 and a clock signal to FPGA 400. A pulse on PROGRAM pin of the FPGA 400 initiates the configuration process. CONF DONE indicates the completion of the configuration process. During the configuration, it remains in a 'low' state and after completion of configuration it oes to a 'high' state, indicating the end of configuration. The state transition may be vice-versa also depending on the logic followed by the circuit. A STATUS pin is used to indicate permanent error in configuration. If the STATUS pin has a 'high' pulse the configuration process is aborted. As in case of CONF_DONE pin, the STATUS pin can be set to abort the configuration when it receives a 'low' signal.

A pulse on RELOAD indicates that some error has been detected in the frame and causes the controller 402 to decrement the address by one frame so that the erroneous frame can be reloaded. A clock signal is provided to the FPGA 400 by the controller through CONF_CLK input pin. Data to FPGA 400 comes from memory device 404 via data pins DIN.

There can be n number of data pins depending on the FPGA. FIG. 4, used only for illustrative purposes, depicts a FPGA that can accept data in one byte at a time therefore, it has 8 data input pins DIN<0:7>. But a FPGA 400 that accepts data in serial mode, may have only one pin and memory device 404 may be of X1 type.

Memory device 404 can also be within the controller. In both the embodiments, addresses are provided to the memory device 404 by controller 402.

Figure 5:
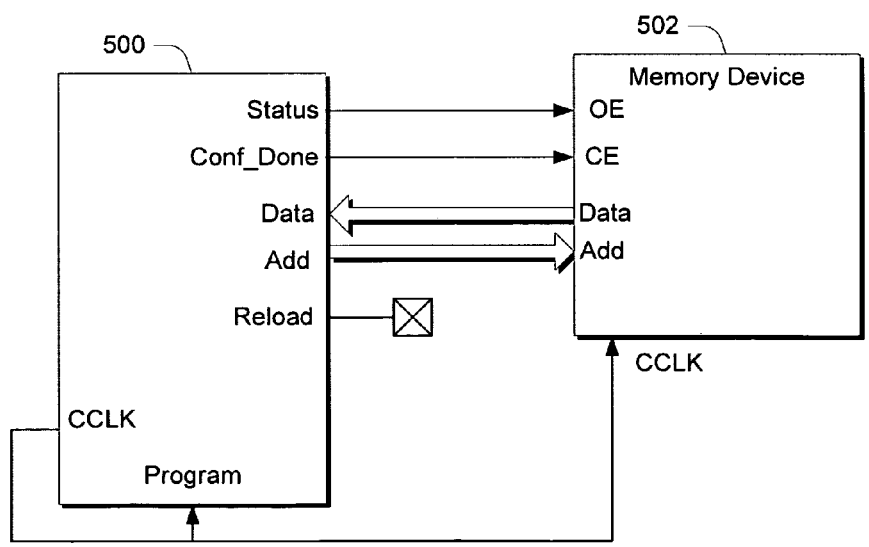
FIG. 5 shows an interface of FPGA with a memory device when working in MASTER mode.

FIG. 5 shows an interface of a FPGA 500 with a memory device 502 when working in MASTER mode, that can be employed in one or more embodiments. In master mode, FPGA 500 controls its own configuration operation. The addresses and clock signal (in case of synchronous memory) to the memory 502 are provided by the FPGA 500 itself. The CONF_DONE pin of the FPGA 500 indicates whether the configuration is in progress or not. The CONF_DONE pin is connected with the chip enable signal (CE) of the memory device 502. When the configuration process is initiated, the CONF_DONE signal enables the memory device 502 and disables it at the end of the process. The STATUS pin indicates that a permanent error has been detected during configuration. This pin is connected to output enable (OE) of the memory device 502. Since addresses are provided to memory device 502 by the FPGA 500, the RELOAD signal is not connected outside the FPGA 500. Data and addresses are exchanged between the FPGA 500 and the memory 502 through the DATA and ADD lines.

Figure 6:
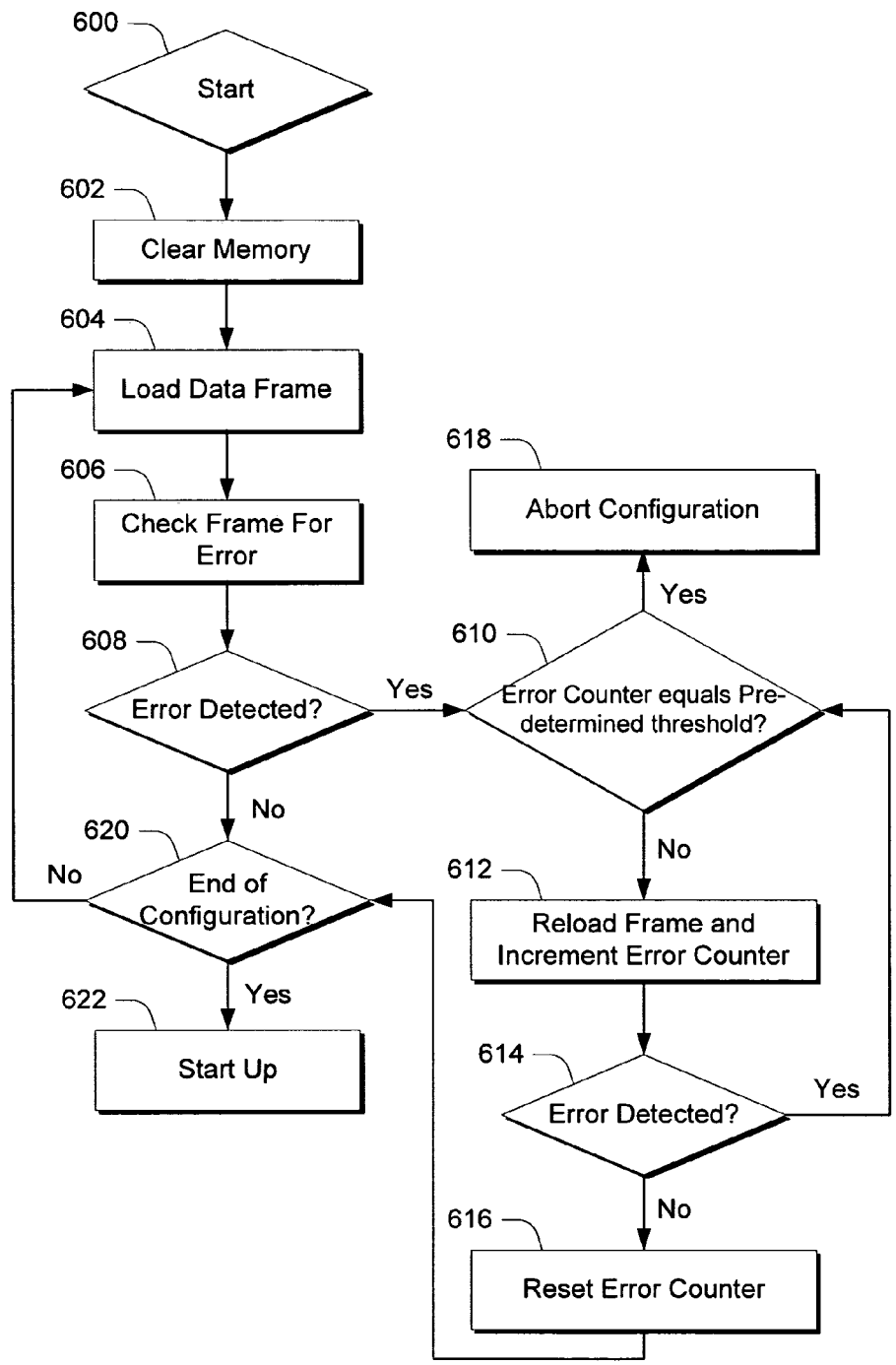
FIG. 6 is a flow chart illustrating an example method of programming a FPGA device in accordance with one or more embodiments.

FIG. 6 is a flow chart illustrating an example method of configuring a FPGA in accordance with one or more embodiments. The process starts with the FPGA coming into configuration mode 600, following which the configuration memory is cleared 602. If only a partial configuration is to be done, then the memory is not cleared. A frame is loaded in the memory and the loaded frame is transferred to the frame register of the FPGA in step 604. This configuration data simultaneously goes to an error detection circuit. Once the complete frame is loaded in the frame register but before it is loaded to the memory cells of the FPGA, it is checked for errors by an error detection circuit in step 606. If no error is detected at step 608, then the configuration process goes onto step 620 where it is checked whether configuration is over or not. If configuration is not over, then the process flow returns back to step 604 where the next frame is loaded and transferred to the frame register. This process goes on until configuration of the FPGA is completed.

In case an error is detected at step 608, the process flow is transferred to step 610, where a comparator in the error checking circuit compares an error counter value with a pre-determined threshold value 'n'. If the error counter value is less than the threshold, then at step 612 the previous frame is reloaded again in the memory, reloaded frame is transferred to the frame register and the error counter is incremented by one. After the complete frame is reloaded in the frame register, it is again checked for errors in step 614. If the error persists, then a RELOAD signal is generated and process flow returns to step 610. This process continues until the error counter value exceeds the pre-determined threshold or the error does not persist when checked at step 614. If error counter value exceeds the pre-determined threshold then the configuration process is aborted indicating permanent error in step 618. Otherwise, in case no error is detected in the reloaded frame at step 614, the error counter is reset in step 616 and the process flow is redirected to step 620 where end of configuration is checked. If configuration is over, then start-up sequence starts 622 and the FPGA begins with its normal operation, otherwise the next frame is loaded in step 604. In an example embodiment, another error counter is incremented when an error occurs, but is not reset when a frame is successfully loaded. If this error counter exceeds another pre-determined threshold, the configuration process is aborted.

Figure 7:
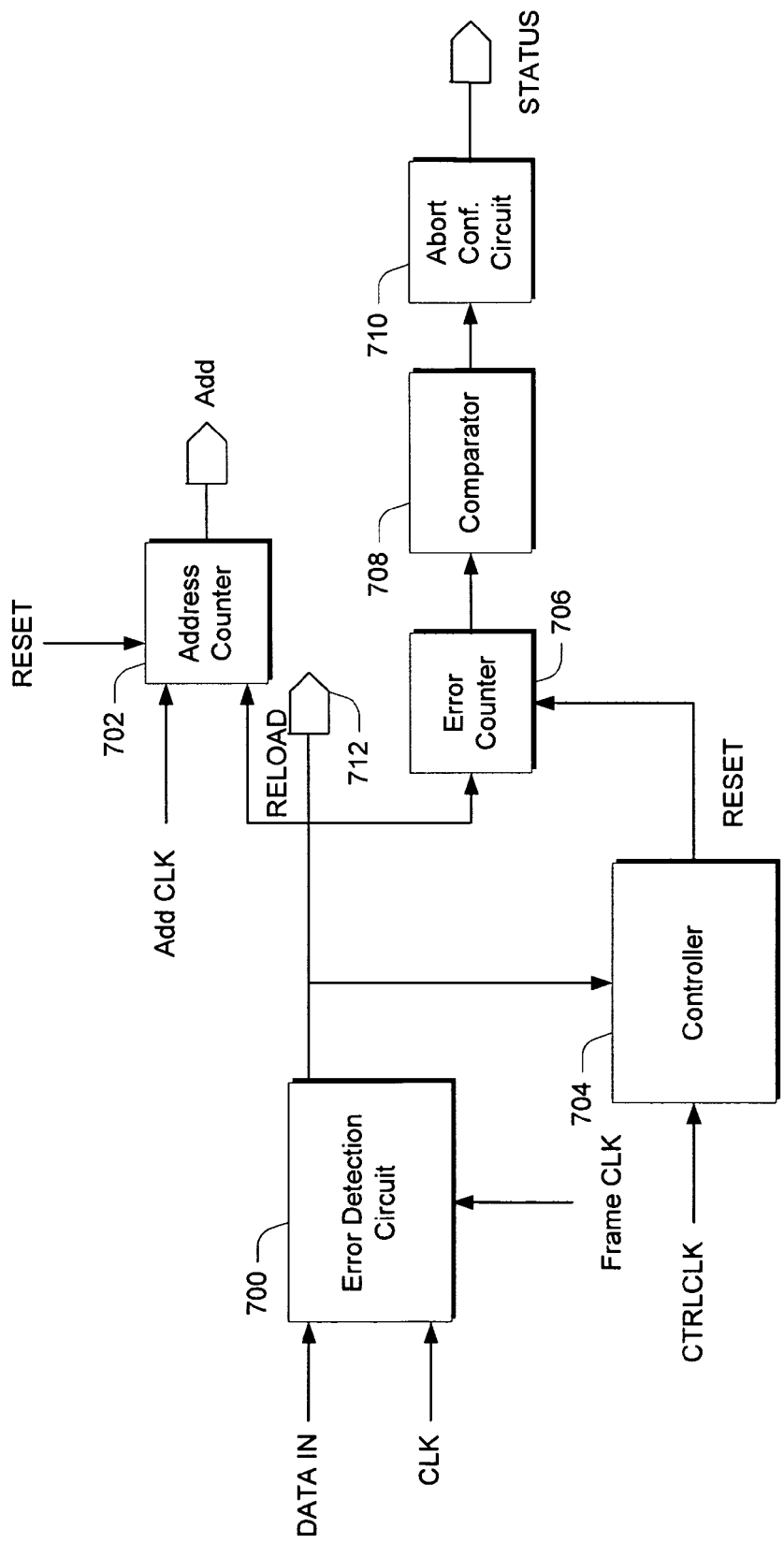
FIG. 7 shows an improved control logic within the FPGA that can be used in accordance with one or more embodiments.

FIG. 7 shows the block diagram of a controller circuit in accordance with one or more embodiments. It contains an error detection circuit 700, which is used to detect errors in the frame. The error detection circuit can implement various error detection algorithms such as parity check, CRC check etc. An Error counter 706 is provided to maintain a counter indicating the number of times an error has been detected in the loaded frame. A Comparator circuit 708 is used to compare the error counter value to the pre-determined threshold value 'n'. Abort configuration circuit 710 aborts the configuration if the error counter value matches with the pre-determined threshold value 'n'. An Address counter 702 provides addresses to the memory when the FPGA works in Master mode operation. In Slave mode the addresses are provided by an external controller or master FPGA. Controller circuit 704 is used to RESET the error counter value. The functioning of circuit is as follows:

Data from the memory device (see FIGS. 4 and 5) is loaded in the frame register (See FIG. 3) of the FPGA and simultaneously transferred to the Error detection circuit 700. Once the complete frame is loaded in frame register, a configuration state machine (not shown) generates a FRAMECLK signal used to check the frame for errors. CTRLCLK, another signal generated by the state machine, goes to the Controller circuit 704 and is used by it to sample the RELOAD signal. The ADDCLK signal also generated by the configuration state machine (in case of master mode) goes to the Address counter 702 and is used to increment the address in the memory so that the next frame can be loaded.

If an error is detected in a frame during the configuration process, a RELOAD signal is activated. This signal goes to Address counter 702, Error counter 706 and Controller circuit 704. The Error counter 706 increments the error counter value on detection of RELOAD signal, while the Address counter 702 decrements its value by one frame in case the FPGA is working in the Master mode. If the FPGA is working in the slave mode, the RELOAD pad 712 causes an external Controller device or Master FPGA to decrement its address counter by one frame. Both of these steps cause the frame to be reloaded in the configuration memory and the reloaded frame to be transferred to the frame register again. Once the frame is reloaded in the frame register and no error is detected in the frame, the Controller 704 generates the RESET signal to reset the error counter value. If the error is encountered again in the reloaded frame, the error counter value is incremented each time and compared by the Comparator 708 to check whether the error counter value has become equal to a pre-determined threshold value 'n'. When the values become equal, the Abort Config circuit 710 activates the STATUS signal causing the configuration to abort.

Hence, using this apparatus an erroneous frame can be reloaded again in case of error during the configuration process without the need to abort the configuration process on each error and reload all the frames all over again and thus saving a lot of configuration time and effort. In an example embodiment, the configuration process is not allowed to enter into an infinite loop in case errors persist through the use of the pre-determined threshold.

The embodiments have been presented for purposes of illustration and are not intended to be exhaustive or limited to the form disclosed. Many modifications and variations will be apparent to those of ordinary skill in the art.

The described embodiments have been described as practiced for a FPGA device configuration. However, the embodiments can be practiced in relation to any Programmable Logic Device (PLD).

The steps and modules described herein and depicted in the drawings may be performed or constructed in either hardware or software or a combination of both, the implementation of which will be apparent to those skilled in the art from the preceding description and the drawings. Certain modifications may be made to the hereinbefore described embodiments without departing from the spirit and scope of the claimed subject matter, and these will be apparent to persons skilled in the art.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Although the embodiments have been described in language specific to structural features and/or methodological steps, it is to be understood that the embodiments defined in the appended claims are not necessarily limited to the specific features or steps described. Rather, the specific features and steps are disclosed as example forms of implementing the claimed embodiments.

The invention claimed is:

1. A method for detecting errors in configuration data frames loaded into a frame register of a Programmable Logic Device (PLD) comprising:
   providing a programmable logic device (PLD) having a frame register; and
   using a counter, associated with the PLD, in conjunction with a threshold value to determine whether a configuration data frame is to be reloaded into the frame register if errors are encountered.

2. The method of claim 1, wherein said using comprises, for an individual data frame for which an error is encountered, comparing a counter value in said counter with the threshold value and, if said counter value is less than the threshold value, reloading said data frame in said frame register and incrementing the counter value by 1.

3. The method of claim 2, wherein said reloading is accomplished by generating a reload signal.

4. The method of claim 2, further comprising repeating said comparing and reloading for said data frame until either said counter value exceeds said threshold value or an error associated with said data frame does not persist.

5. The method of claim 2 further comprising, if said reloading loads the data frame and said data frame does not have an error, resetting the counter and loading additional data frames if additional data frames remain to be loaded.

6. The method of claim 1 further comprising using cyclic redundancy checking to check for data frame errors.

7. The method of claim 1, wherein said PLD comprises an FPGA.

8. The method of claim 1, wherein said PLD is configured to operate in a master mode.

9. The method of claim 8, wherein when a data frame is reloaded due to an encountered error, reloading is accomplished by adjusting an address counter.

10. The method of claim 1, wherein said PLD is configured to operate in a slave mode.

11. The method of claim 10, wherein when a data frame is reloaded due to an encountered error, reloading is accomplished by signaling an external controller to adjust an address counter.

12. A programmable logic device (PLD) comprising:
    a frame register; and
    an error counter associated with the frame register, the error counter being configured to be used in conjunction with a threshold value, wherein the PLD is configured to use the error counter to count errors and, based upon an error count and the threshold value, determine whether a configuration data frame is to be reloaded into the frame register.

13. The programmable logic device (PLD) of claim 12, wherein said PLD is configured to use said error counter and threshold value by, for an individual data frame for which an error is encountered, comparing a counter value in said counter with the threshold value and, if said counter value is less than the threshold value, reloading said data frame in said frame register and incrementing the counter value by 1.

14. The programmable logic device (PLD) of claim 13, wherein said PLD is configured to accomplish said reloading by generating a reload signal.

15. The programmable logic device (PLD) of claim 13, wherein said PLD is configured to repeat said comparing and reloading for said data frame until either said counter value exceeds said threshold value or an error associated with said data frame does not persist.

16. The programmable logic device (PLD) of claim 13, wherein said PLD is configured to, if said reloading loads the data frame and said data frame does not have an error, reset the counter and load additional data frames if additional data frames remain to be loaded.

17. The programmable logic device (PLD) of claim 12, wherein said PLD is configured to use cyclic redundancy checking to check for data frame errors.

18. The programmable logic device (PLD) of claim 12, wherein said PLD comprises an FPGA.

19. The programmable logic device (PLD) of claim 12, wherein said PLD is configured to operate in a master mode.

20. The programmable logic device (PLD) of claim 19, wherein said PLD is configured to reload a data frame when an error is encountered by adjusting an address counter.

21. The programmable logic device (PLD) of claim 12, wherein said PLD is configured to operate in a slave mode.

22. The programmable logic device (PLD) of claim 21, wherein said PLD is configured to reload a data frame when an error is encountered by signaling an external controller to adjust an address counter.

23. A method comprising:
    providing a programmable logic device (PLD) having a frame register;
    sequentially loading configuration data frames into the frame register;

checking for errors in said configuration data frames during said sequentially loading; and correcting errors during said sequentially loading without reloading one or more previously-loaded different configuration data frames.

24. The method of claim 23, wherein said sequential loading and checking are performed using a counter associated with the PLD, in conjunction with a threshold value to determine whether a configuration data frame is to be reloaded into the frame register if errors are encountered.

25. The method of claim 23, wherein said PLD comprises an FPGA.

26. The method of claim 23, wherein said PLD is configured to operate in a master mode.

27. The method of claim 23, wherein said PLD is configured to operate in a slave mode.

28. A programmable logic device (PLD) comprising:
a frame register; and
circuitry configured to sequentially load configuration data frames into the frame register and check for errors in said configuration data frames during sequential loading and correct errors during sequential loading without reloading previously-loaded different configuration data frames.

29. The programmable logic device (PLD) of claim 28, wherein said circuitry comprises an error checking circuit configured to implement a cyclic redundancy checking algorithm.

30. The programmable logic device (PLD) of claim 28, wherein said circuitry comprises an error counter circuit configured to maintain a counter indicating a number of times an error has been detected in a loaded frame.

31. The programmable logic device (PLD) of claim 28, wherein said circuitry comprises a comparator circuit for comparing an error counter value to a threshold value to ascertain whether to reload a data frame for which an error is encountered.

32. The programmable logic device (PLD) of claim 28, wherein said circuitry comprises:
an error checking circuit configured to implement a cyclic redundancy checking algorithm;
an error counter circuit configured to maintain a counter indicating a number of times an error has been detected in a loaded frame; and
a comparator circuit for comparing an error counter value to a threshold value to ascertain whether to reload a data frame for which an error is encountered.

33. The programmable logic device (PLD) of claim 28, wherein said PLD comprises an FPGA.

34. The programmable logic device (PLD) of claim 28, wherein said PLD is configured to operate in a master mode.

35. The programmable logic device (PLD) of claim 34, wherein said circuitry comprises an address counter for providing addresses when a data frame is to be reloaded.

36. The programmable logic device (PLD) of claim 28, wherein said PLD is configured to operate in a slave mode.

37. The programmable logic device (PLD) of claim 28, wherein said circuitry comprises an external controller for providing addresses when a data frame is to be reloaded.

* * * * *

UNITED STATES PATENT AND TRADEMARK OFFICE
CERTIFICATE OF CORRECTION

| | | |
|---|---|---|
| PATENT NO. | : 7,774,682 B2 | Page 1 of 1 |
| APPLICATION NO. | : 12/032448 | |
| DATED | : August 10, 2010 | |
| INVENTOR(S) | : Ashish Kumar Goel et al. | |

It is certified that error appears in the above-identified patent and that said Letters Patent is hereby corrected as shown below:

On the Title page, Item (76), Inventors: delete "Rajauri" and insert -- Rajouri --, therefor.

On the Title page, below Item (65), insert -- (30)    Foreign Application Priority Data
               Sep. 20, 2002   (IN)    ................958/02 --.

On page 1, Item (56), column 2, line 5 under "Other Publications", delete "Xillinx's and insert -- Xilinx's --, therefor.

Signed and Sealed this

Twenty-third Day of November, 2010

David J. Kappos
*Director of the United States Patent and Trademark Office*